United States Patent
Gopalraj

(10) Patent No.: US 12,072,362 B2
(45) Date of Patent: Aug. 27, 2024

(54) COMPONENT IMPEDANCE MEASUREMENT AND CHARACTERIZATION AT HIGH TRANSIENT VOLTAGES

(71) Applicant: Analog Devices, Inc., Wilmington, MA (US)

(72) Inventor: Mohit Gopalraj, Billerica, MA (US)

(73) Assignee: Analog Devices, Inc., Wilmington, MA (US)

( * ) Notice: Subject to any disclaimer, the term of this patent is extended or adjusted under 35 U.S.C. 154(b) by 89 days.

(21) Appl. No.: 17/517,449

(22) Filed: Nov. 2, 2021

(65) Prior Publication Data
US 2023/0139107 A1 May 4, 2023

(51) Int. Cl.
G01R 27/02 (2006.01)
G01R 31/319 (2006.01)
H02H 9/04 (2006.01)

(52) U.S. Cl.
CPC ....... G01R 27/02 (2013.01); G01R 31/31905 (2013.01); H02H 9/044 (2013.01)

(58) Field of Classification Search
CPC ........ G01R 27/00; G01R 27/02; G01R 31/00; G01R 31/28; G01R 31/317; G01R 31/3181; G01R 31/319; G01R 31/31903; G01R 31/31905; H02H 9/00; H02H 9/04; H02H 9/044
USPC ................................. 324/600, 629, 637, 638
See application file for complete search history.

(56) References Cited

U.S. PATENT DOCUMENTS

| | | | |
|---|---|---|---|
| 6,653,848 B2 | 11/2003 | Adamian et al. | |
| 6,960,920 B2 | 11/2005 | Kamitani | |
| 7,098,670 B2 | 8/2006 | Cole | |
| 7,222,033 B1* | 5/2007 | Newson | G06F 30/367 |
| | | | 702/65 |

(Continued)

FOREIGN PATENT DOCUMENTS

| | | | |
|---|---|---|---|
| CN | 104871012 B | 8/2015 | |
| WO | WO-2005069943 A2 * | 8/2005 | ............. G01R 27/04 |

OTHER PUBLICATIONS

Bernard Ang, "Tips on using Frequency Sweep and List with your Function Generator", Dec. 12, 2018, Keysight Technologies.*

*Primary Examiner* — Hoai-An D. Nguyen
(74) *Attorney, Agent, or Firm* — Knobbe, Martens, Olson & Bear, LLP

(57) ABSTRACT

Apparatus and methods for characterizing electrical components for evaluating performance in a high voltage transient protection circuit. Impedance graphs provided by manufacturers for electrical components are typically low voltage measurements that do not necessarily accurately reflect component performance at high voltages above 150 volts. It is important to characterize and understand the behavior of these components at high voltages in order to ensure the components will protect circuitry as expected. In certain embodiments, a characterization method includes obtaining time domain voltage measurements from two terminals of a device under test (DUT) as it is exposed to high voltage transients from an electrical fast transient (EFT) generator. The time domain voltage data is transformed into frequency domain voltage data using a transform algorithm, and additional analysis is performed to derive scattering parameters, impedance, and other valuable metrics for component characterization.

24 Claims, 12 Drawing Sheets

(56) References Cited

U.S. PATENT DOCUMENTS

| | | |
|---|---|---|
| 7,359,814 B1 | 4/2008 | Nakayama et al. |
| 7,526,391 B2 | 4/2009 | Bickel |
| 7,777,497 B2 | 8/2010 | Albert-Lebrun et al. |
| 10,203,361 B2 | 2/2019 | Ugawa |
| 10,734,806 B2 | 8/2020 | Zhao et al. |
| 10,768,262 B2 | 9/2020 | Danesh et al. |
| 11,009,558 B2 | 5/2021 | Danesh et al. |
| 2011/0238383 A1 | 9/2011 | Metzger |
| 2021/0025929 A1 | 1/2021 | Stuart et al. |

* cited by examiner

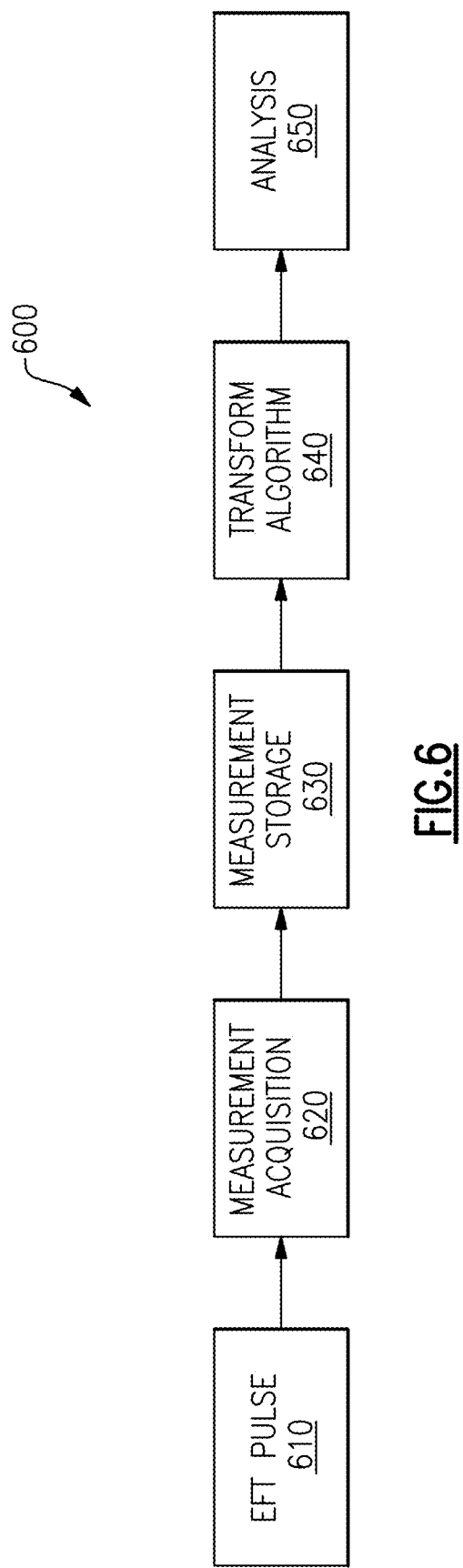

COMPONENT IMPEDANCE MEASUREMENT AND CHARACTERIZATION AT HIGH TRANSIENT VOLTAGES

BACKGROUND OF THE INVENTION

Field of the Invention

Embodiments of the invention relate to electronics, and more particularly to electrical component characterization.

Description of the Related Art

High voltage transients are short duration surges of electrical energy which result from a sudden release of energy, such as by heavy inductive loads, lightning, or arising from charge released from an object or person to an electronic system. High voltage transients can also be referred to as electrical overstress (EOS) events. High voltage transient activity can lead to immediate failure in integrated circuits, or cause damage which is not readily apparent and results in erratic operation. In order to protect electronic devices from high voltage transient phenomena, transient protection circuits (for example, EOS protection circuits) are often included to suppress or redirect transient energy away from sensitive integrated circuits or other core circuitry.

When using an electrical component in a circuit exposed to electrical overstress (EOS), it is important to understand the behavior of the electrical component when exposed to high voltage transients.

SUMMARY OF THE INVENTION

Disclosed are apparatus and methods for characterizing electrical components for evaluating performance in a high voltage transient protection circuit. Impedance graphs provided by manufacturers for electrical components are typically low voltage measurements that do not necessarily accurately reflect component performance at high voltages above 150 volts. It is important to characterize and understand the behavior of these components at high voltages in order to ensure the components will protect circuitry as expected. In certain embodiments, a characterization method includes obtaining time domain voltage measurements from two terminals of a device under test (DUT) as it is exposed to high voltage transients from an electrical fast transient (EFT) generator. The time domain voltage data is transformed into frequency domain voltage data using a transform algorithm, and additional analysis is performed to derive scattering parameters, impedance, and other valuable metrics for component characterization.

In one aspect, a method of electrical characterization includes connecting a first terminal of an electrical component to a transient generator, connecting a second terminal of the electrical component to a load, obtaining a first plurality of voltage versus time measurements at the first terminal of the electrical component in response to an electrical transient from the transient generator, obtaining a second plurality of voltage versus time measurements at the second terminal of the electrical component in response to the electrical transient, processing the first plurality of voltage versus time measurements and the second plurality of voltage versus time measurements to generate frequency domain data, and determining at least one scattering parameter from the frequency domain data.

In another aspect, an electronic component characterization system includes a transient generator configured to provide an electrical transient to a first terminal of an electrical component undergoing characterization, a load configured to connect to a second terminal of the electrical component, one or more voltage probes configured to obtain a first plurality of voltage versus time measurements at the first terminal of the electrical component in response to the electrical transient, and to obtain a second plurality of voltage versus time measurements at the second terminal of the electrical component in response to the electrical transient, and a computer configured to process the first plurality of voltage versus time measurements and the second plurality of voltage versus time measurements to generate frequency domain data, and to determine at least one scattering parameter from the frequency domain data.

In yet another aspect, an electronic component characterization system includes a transient generator configured to provide an electrical transient to a first terminal of an electrical component undergoing characterization, a load configured to connect to a second terminal of the electrical component, one or more voltage probes configured to obtain a first plurality of voltage versus time measurements at the first terminal of the electrical component in response to the electrical transient, and to obtain a second plurality of voltage versus time measurements at the second terminal of the electrical component in response to the electrical transient, and means for processing the first plurality of voltage versus time measurements and the second plurality of voltage versus time measurements to generate frequency domain data and at least one scattering parameter.

BRIEF DESCRIPTION OF THE DRAWINGS

FIG. 6 is a block diagram illustrating one embodiment of a method of data acquisition and analysis for high voltage component characterization.

DETAILED DESCRIPTION OF THE PREFERRED EMBODIMENT

Figure 1:
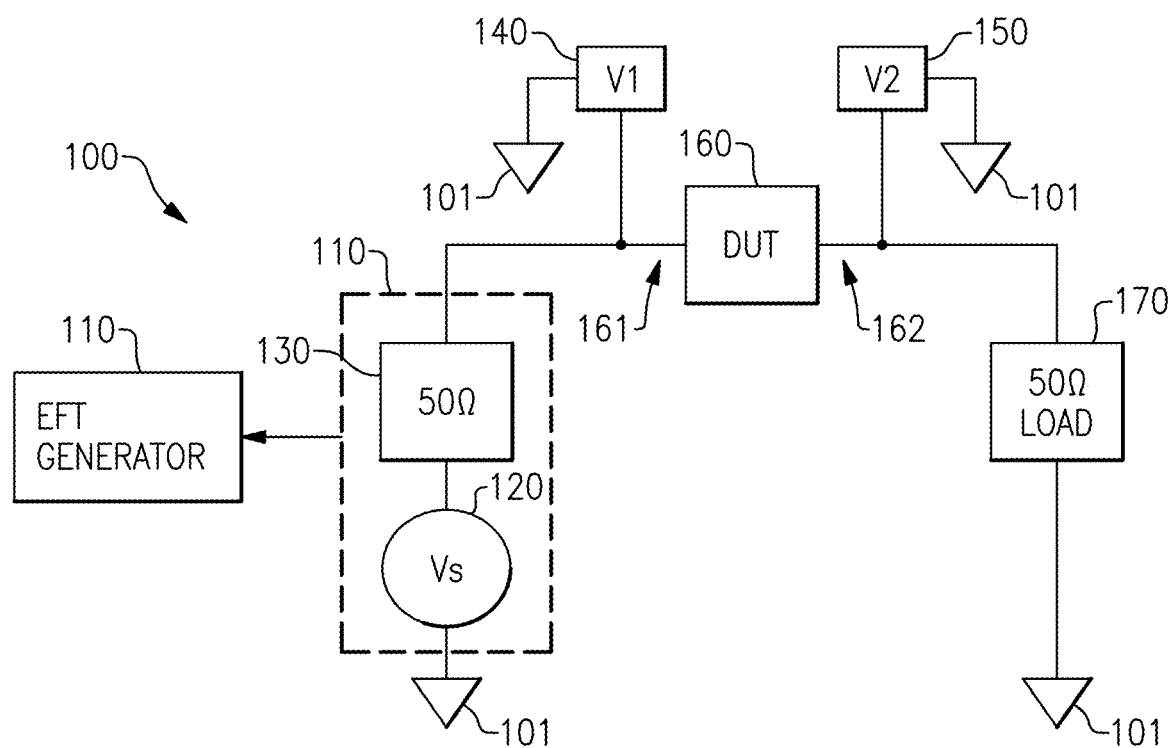
FIG. 1 is a schematic of one embodiment of a test circuit setup for high voltage transient characterization of a component being evaluated.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Electrical components typically include datasheets providing performance information about the component. However, the performance information on datasheets is typically based on low voltage measurements.

When using an electrical component in a circuit exposed to electrical overstress (EOS), it is important to understand the behavior of the electrical component when exposed to high voltages, since the component's behavior can be significantly different under these conditions.

For example, during a design phase a circuit designer can face the issue of selecting a suitable transient voltage suppression (TVS) diode, common-mode choke, ferrite, or other suitable device(s) for providing protection against high voltage transient phenomenon. Although a manufacturer's impedance versus frequency graph can be used to select a component, such impedance graphs are either vector network analyzer (VNA) measurements or low voltage measurements that are not entirely accurate descriptions of the component's behavior at high voltages, such as 150 V or more.

It is desirable to characterize and understand the behavior of these components at high voltages in order to ensure that they provide circuit protection as expected at these high voltages. With the right information, correct and more robust electrical components can be chosen for better electromagnetic compatibility (EMC) performance.

In certain embodiments herein, a method of electrical characterization is provided in which a first terminal of an electrical component is connected to a transient generator (for instance, an electrical fast transient or EFT generator) and a second terminal of the electrical component is connected to a load. The method includes obtaining a first set of voltage versus time measurements at the first terminal of the electrical component in response to an electrical transient from the transient generator, obtaining a second set of voltage versus time measurements at the second terminal of the electrical component in response to the electrical transient, processing the first and second sets of voltage versus time measurements to generate frequency domain data (for example, using a fast Fourier transform or FFT), and determining at least one scattering parameter from the frequency domain data.

Such electrical characterization can be used to determine an S21 parameter, an S12 parameter, an S11 parameter, and/or an S22 parameter. Moreover, the scattering parameters can be used to generate data representing an impedance curve (for example, as an .s2p file or other suitable format) that characterizes the electrical component.

Accordingly, the measurement and analysis techniques provided herein can be used to obtain impedance versus frequency data (for instance, impedance graphs) at the transient voltages of interest, for example, at 500V, 1 kV, 2 kV and 4 kV.

Thus, the high voltage performance of various components can be analyzed and the one with the best performance over the applicable high voltage range can be chosen. Such characterization saves time and resources in going through unnecessary iterations on a test/evaluation board trying to figure out the best way to protect the circuitry against high voltage transients.

The electrical characterization techniques herein can advantageously use only voltage measurements to compute the characteristics of the component being tested. By providing electrical characterization in this manner, the use of any current probes can be avoided. For example, an added advantage of using only voltage measurements is that there are little to no restrictions based on the size or the gauge of wire connected to the component. In contrast, a current probe is constrained by a size of wire that can fit through the current probe.

To avoid the effects of probe loading, in certain implementations the same probe is used to obtain voltage versus time measurements at the first terminal and at the second terminal. For example, the probe can be positioned at the first terminal of the electrical component to obtain the first set of the voltage versus time measurements in response to the electrical transient from the transient generator. Additionally, the probe can be repositioned at the second terminal and the second set of voltage versus time measurements can be obtained in response to the transient generator regenerating the electrical transient. Such measurements can be repeated for multiple voltage levels of the electrical transient to gather further data.

Not only can such characterization techniques be used to characterize two terminal components, but components with additional terminals as well. In one example, an electrical component includes a pair of input terminals and a pair of output terminals. Additionally, the pair of input terminals are connected to one another to provide a first terminal for electrical characterization, and the pair of output terminals are connected to one another to provide a second terminal for electrical characterization.

FIG. 1 is a schematic of one embodiment of a test circuit setup 100 for high voltage transient characterization of a component being evaluated.

Referring initially to FIG. 1, an example circuit for impedance measurement and high voltage characterization of electronic components is shown generally by 100. The setup 100 serves to measure a device under test (DUT) 160, and includes a transient generator 110 (corresponding to an electrical fast transient (EFT) generator, in this example), a load 170 (50 Ω, in this example), and at least one voltage probe.

As shown in FIG. 1, the EFT generator 110 is represented or modeled as a voltage source 120 in series with an internal resistance 130 (about 50Ω, in this example), and thus is a Thevenin model of the EFT generator 110. A first terminal of the EFT generator 110 drives the DUT 160, while a second terminal of the EFT generator 110 is grounded (connected to a ground voltage or ground 101).

The EFT generator 110 is configured to supply the circuit 100 with short duration voltage transients having a selectable amplitude within a desired voltage range, for instance, at least about 200 volts to about 4 kilovolts. The EFT generator 110 can be programmed to generate the electrical transient with desired characteristics, such as amplitude and rise time. Moreover, the EFT generator 110 can be programmed to regenerate a particular electrical transient when needed, which can be used in configurations in which the same voltage probe is used to capture the voltage versus time measurements for each terminal of the DUT 160.

With continuing reference to FIG. 1, an output of the EFT generator 110 is operably connected to a first terminal 161 of a device under test (DUT) 160, which is the electrical component being characterized by the circuit 100. Hereafter, "device under test", "component under test", "electrical device", and "electrical component" are used interchangeably to refer to the DUT 160.

In addition to the first terminal 161, the DUT 160 has at least a second terminal 162, although components with an arbitrary number of terminals may be characterized by substantially the same process as described herein. In a multi-terminal device, the first terminal 161 and second terminal 162 are not necessarily the numerical terminals 1 and 2 of the device. The second terminal 162 is connected to ground 101 by way of a known load 170, which may be resistive and have a resistance selected to match the internal resistance 130 of the EFT generator 110 for impedance matching.

The circuit 100 further includes a first voltage measurement device or probe 140 electrically connected to the first terminal 161 and a second voltage measurement device or probe 150 electrically connected to the second terminal 162. Such process can correspond to, for example, probes of an oscilloscope. However, any suitable probe or probes can be used.

Although shown as including two probes, a common or same probe can be used to capture voltage versus time measurements from the DUT 160. For example, the EFT generator 110 can apply a pulse, and measurements of the DUT 160 at the first terminal 161 can be obtained by a probe. Thereafter, the EFT generator 110 can replicate the pulse, and measurements of the DUT 160 at the second terminal 162 can be obtained using the same probe. In certain implementations, measurements at the first terminal 161 and the second terminal 162 are obtained in response to multiple transient pulses associated with different characteristics (for example, different peak amplitudes).

As schematically depicted by the ground symbols adjacent to the first terminal 161 and the second terminal 162 of the DUT 160, the voltage measurements are single-ended measurements referenced to ground, in this embodiment.

The voltage probe or probes can capture the voltage versus time measurements in any suitable manner. For example, such time domain voltage data can be captured at a preconfigured sampling rate and for a preconfigured record length. In certain embodiments, the sampling rate and record length may be configured automatically during signal capture. Signal capture may also occur synchronously or asynchronously depending on the configuration of the circuit 100 and the measurement probe(s).

An oscilloscope or other measurement device capable of interfacing with a computer may be selected for this purpose and to additionally store the time domain voltage measurements in a computer memory for analysis. In other embodiments, the time domain voltage measurements may be stored and analyzed onboard a capable measurement device that includes the computer. As described in detail herein, the data containing the time domain voltage measurements undergoes additional processing steps to analyze the data in the frequency domain.

Figure 2A:
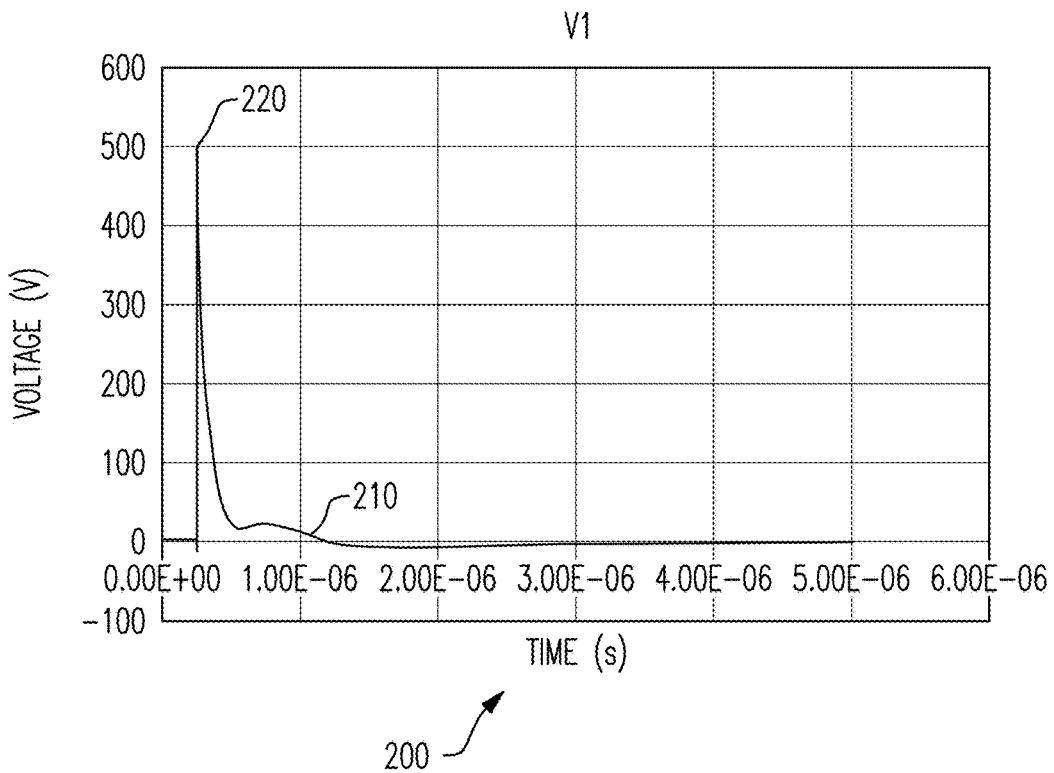
FIG. 2A is one example of a time domain plot of transient voltage response measured from a first terminal of an electronic component.
Figure 2B:
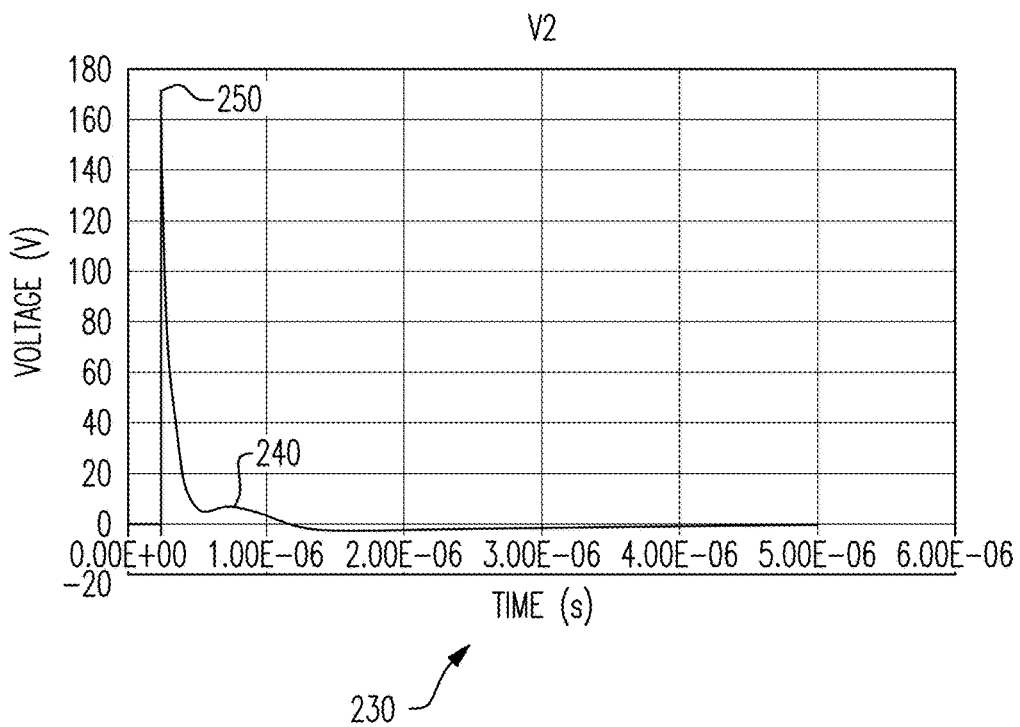
FIG. 2B is one example of a time domain plot of transient voltage response measured from a second terminal of the electronic component.

FIG. 2A is one example of a time domain plot of transient voltage response measured from a first terminal of an electronic component. FIG. 2B is one example of a time domain plot of transient voltage response measured from a second terminal of the electronic component.

Referring now to FIG. 2A and FIG. 2B, an example plot of a voltage transient captured by the first voltage measurement device 140 over a span of 6 microseconds is indicated generally by 200. A curve 210 of the voltage transient shows a brief peak 220 of approximately 500 volts representing a local maximum of the transient observed during a capture period. A corresponding plot of the transient of FIG. 2A after it has passed through the device under test 160 is indicated generally at 230, observed by the second voltage measurement device 150 during the same capture period. A second curve 240 representing the transient after substantial attenuation by the DUT 160 has a peak 250 of approximately 170 volts. Time domain data can be captured by the first and second voltage measurement devices 140/150 (or by a single measurement device) at a specified sampling rate and record length, given by Equation 1 below, where the duration of the capture period may also be referred to as acquired time.

$$\text{Sampling Rate} = \frac{\text{Record Length}}{\text{Duration of Capture Period}} \qquad \text{Equation 1}$$

Although the plots of FIGS. 2A and 2B illustrate example time domain voltage measurements, the voltage peak of the transient, duration of the capture period, sampling rate, or any other parameter known to one skilled in the art may be adjusted for better characterization of the DUT 160. In some embodiments, multiple iterations of voltage capture can be used in combination with signal processing techniques for broader characterization and impedance measurement.

Figure 3A:
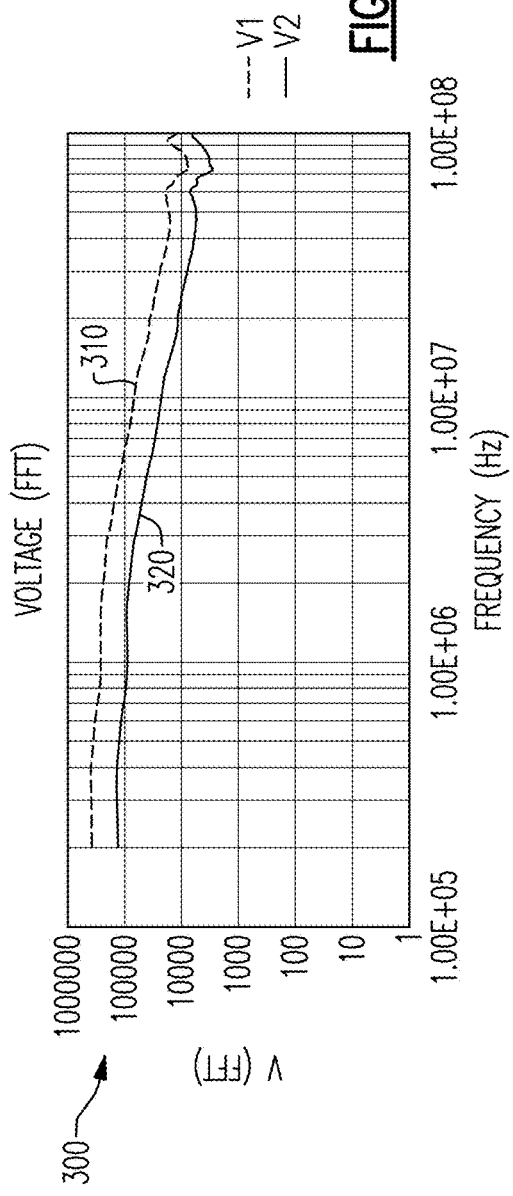
FIG. 3A is one example of a frequency domain plot of the fast Fourier transform of the transient voltage responses of FIG. 2A and FIG. 2B.

FIG. 3A is one example of a frequency domain plot of the fast Fourier transform of the transient voltage responses of FIG. 2A and FIG. 2B.

FIG. 3A is a plot of the transient function of FIGS. 2A and 2B transformed into the frequency domain for further analysis. In the preferred embodiment, a computer or digital storage oscilloscope (DSO) applies a fast Fourier transform (FFT) algorithm to transform the time domain voltage data captured by voltage measurement devices 140/150 into the frequency domain.

In various embodiments, other transforms including a Laplace transform, z-transform, or another Fourier transform algorithm may be used to acquire frequency domain voltage data. The resulting frequency domain transient curves 310 and 320 are stored in a computer memory and can be used to generate a frequency response curve 300 for further analysis. In one embodiment, the frequency domain transient data is converted by a LabVIEW program into a Microsoft Excel spreadsheet format.

Figure 3C:
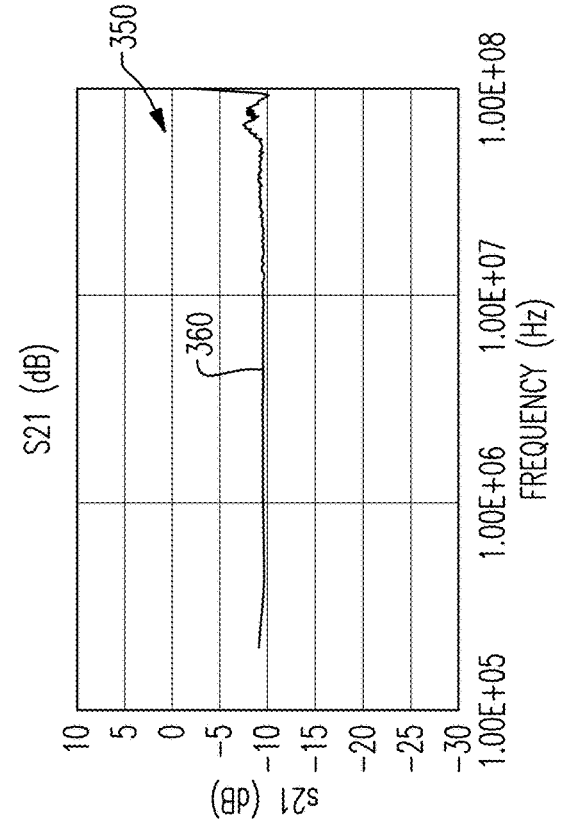
FIG. 3C is a frequency domain plot of FIG. 3B plotted on a logarithmic scale.
Figure 3B:
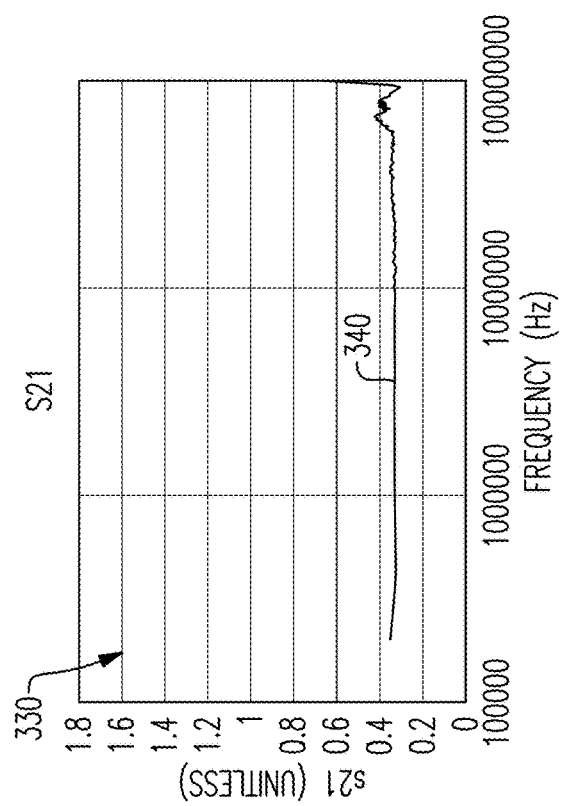
FIG. 3B is one example of a frequency domain plot of a scattering parameter S21 for the transient voltage response of FIG. 3A.

FIG. 3B is one example of a frequency domain plot of a scattering parameter S21 for the transient voltage response of FIG. 3A. FIG. 3C is a frequency domain plot of FIG. 3B plotted on a logarithmic scale.

As persons having ordinary skill in the art will appreciate, scattering parameters (S-parameters) describe electrical behavior of a network or device under test when subjected to steady state stimuli.

With reference to FIGS. 3B and 3C, S21 is one of several scattering parameters useful in characterizing the performance of the DUT 160. S21 is related to insertion loss because it represents the degree of attenuation of the voltage transient after passing through the DUT 160. A unit-less plot of S21 is shown generally by 330, with a curve 340 illustrating the insertion loss of the DUT 160 over a frequency range of 100 kHz to 10 MHz. S21 can be calculated from the frequency domain voltage data of FIG. 3A by Equation 2 below, where V1 and V2 are the instantaneous voltages at a given frequency measured by voltage measurement devices 140 and 150, respectively.

$$S21 = \frac{V2}{V1}$$ Equation 2

Scattering parameter S21 may also be represented on a logarithmic scale using decibels, as in FIG. 3C, according to Equation 3 below. When on a logarithmic scale, S21 is referred to as insertion loss (IL).

$$IL(dB) = -20 \log_{10}|S21|$$ Equation 3

Figure 4:
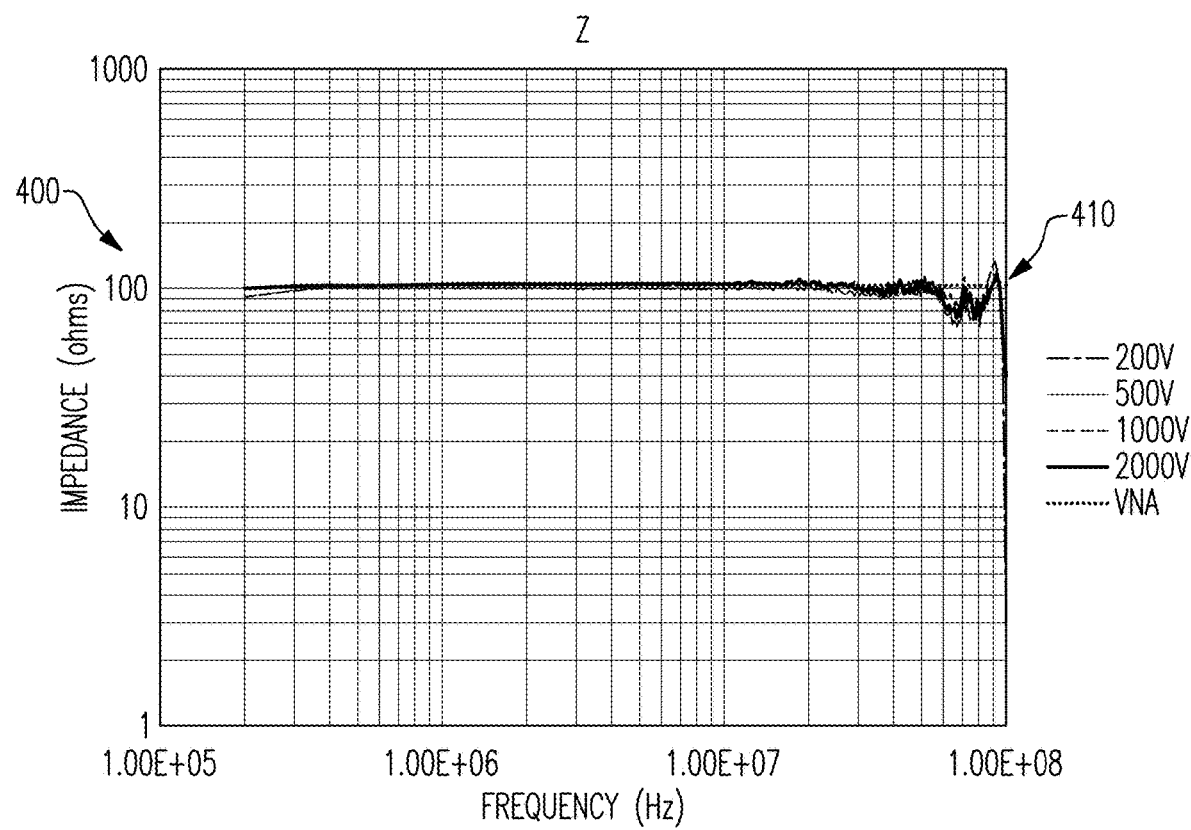
FIG. 4 is one example of a frequency domain plot of impedance curves for several transient responses of a wire-wound resistor.

FIG. 4 is one example of a frequency domain plot of impedance curves for several transient responses of a wire-wound resistor.

Referring now to FIG. 4, an example plot of impedance $Z_{DUT}$ over a frequency range of 100 kHz to 100 MHz for a DUT 160 is indicated generally by 400. The impedance can be calculated from the data of FIGS. 3B and 3C, where $Z_0$ is an impedance of the known load 170 and S21 is a value of the scattering parameter at a given frequency. Equation 4 and Equation 5 below provide example mathematic expressions for calculating impedance.

$$Z_1 = \frac{2 * Z_0 (1 - S21)}{S21}$$ Equation 4

$$Z_{DUT} = \frac{Z_1}{2}$$ Equation 5

In the pictured example, the DUT 160 is an approximately 100 ohm wire-wound resistor. The plot 400 includes a plurality of impedance curves 410 representing impedance of the DUT 160 when exposed to various transient voltages of interest. The EFT generator 110 can supply voltage transients to the DUT 160 having a peak voltage 220 ranging from approximately 200V to 4 kV, although the same method of characterizing the DUT 160 can be used with any high voltage transient.

In some cases the DUT 160 may exhibit nonlinearity, particularly at higher frequencies, which is valuable in understanding how the same component would perform when implemented into an EFT protection circuit. An impedance-frequency curve calculated by a vector network analyzer (VNA) shows how component characterization by the method of the present invention can yield a substantially different result compared to conventional methods.

Figure 5:
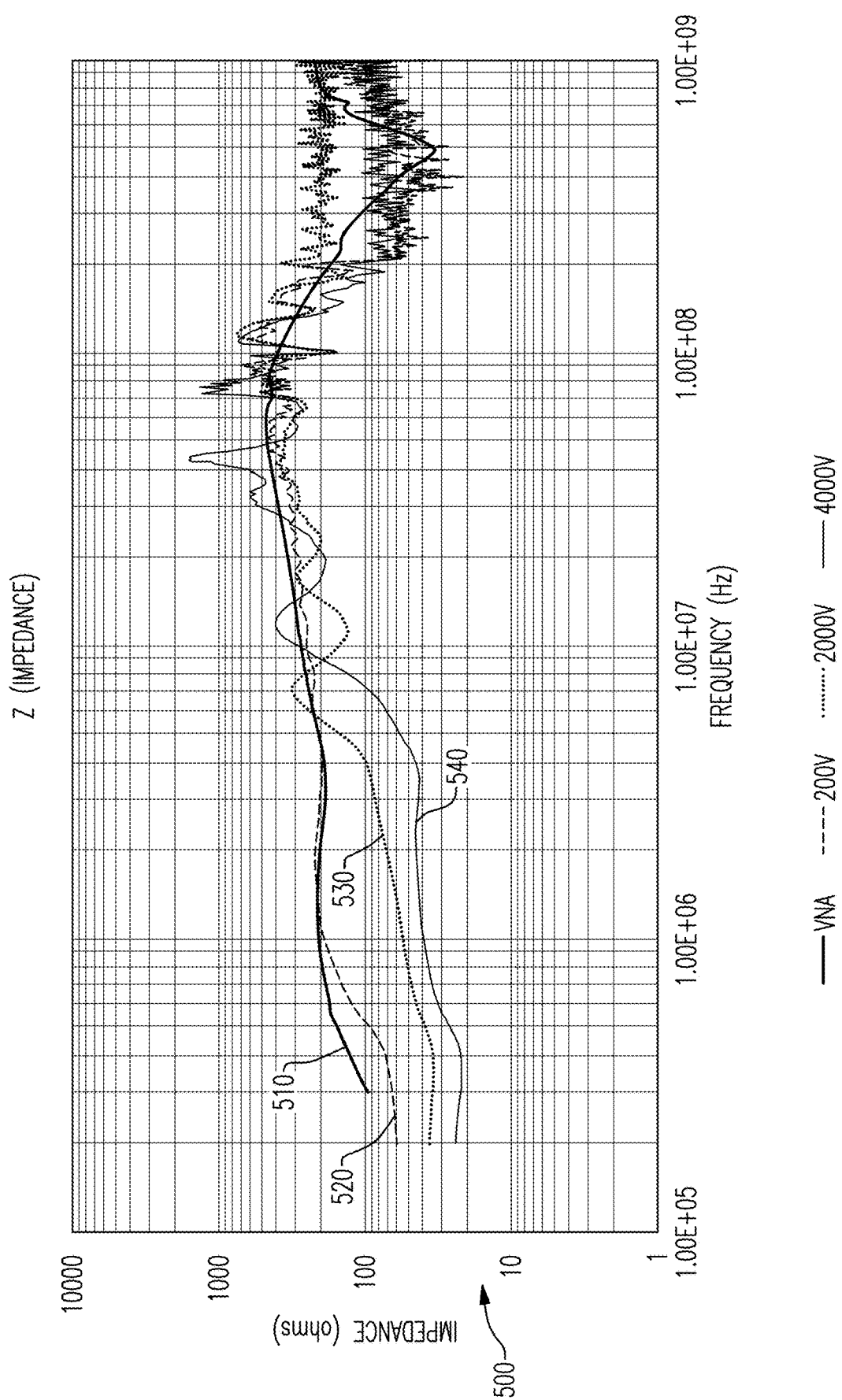
FIG. 5 is a frequency domain plot of impedance curves for several transient responses of different amplitudes.

FIG. 5 is a frequency domain plot of impedance curves for several transient responses of different amplitudes.

Likewise, in FIG. 5 an example plot of impedance $Z_0$ over a frequency range of 100 kHz to 1 GHz for a DUT 160 is indicated generally by 500. In the pictured example, the DUT 160 is a common-mode choke (CMC) by Wurth Elektronik having part number 744844470. Compared to the device of FIG. 4, the device of FIG. 5 is nonlinear over the entire frequency range and performs substantially differently when exposed to various EFT voltages.

A VNA impedance-frequency curve 510 is provided as a rough approximation of the behavior of the DUT 160. Additional impedance curves calculated from the measured response to 200 V, 2 kV, and 4 kV EFTs are indicated by 520, 530, and 540 respectively. These various impedance curves reflect how the behavior of the DUT 160 deviates significantly from the VNA measurement above 200 V, particularly at frequencies in the 1 MHz to 10 MHz range.

FIG. 6 is a block diagram illustrating one embodiment of a method of data acquisition and analysis for high voltage component characterization.

Referring now generally to FIGS. 1 to 6, the method of characterizing components is shown generally by 600. An EFT pulse 610 having a predetermined peak voltage 220 is delivered to the DUT 160 by the EFT generator 110. The voltage measurement devices 140 and 150 (or a shared measurement device) acquire time domain voltage measurements 620 at a specified sampling rate and record length as configured by a technician. The time domain voltage measurement data is stored in a computer memory 630. A computer coupled to the computer memory, uses a transform algorithm 640 (for example a fast Fourier transform) to transform the time domain voltage data into frequency domain voltage data. The computer may also use a Laplace transform, z-transform, discrete time Fourier transform, or any other transform algorithm known to one skilled in the art.

With continuing reference to FIG. 6, The frequency domain voltage data undergoes additional analysis 650 (for instance, using the computer), including calculating scattering parameters (including S21), insertion loss, and impedance from the frequency domain data. Any or all of the results of the analysis can be graphically plotted as in FIGS. 2A through 5. The steps of applying the transform algorithm 640 and analysis 650 may be performed by a LabVIEW program configured to transform and analyze the voltage data and store the results of the analysis in a Microsoft Excel format. The steps 610 through 650 can be repeated with varied EFT pulses for a more robust characterization of the device under test.

Figure 7A:
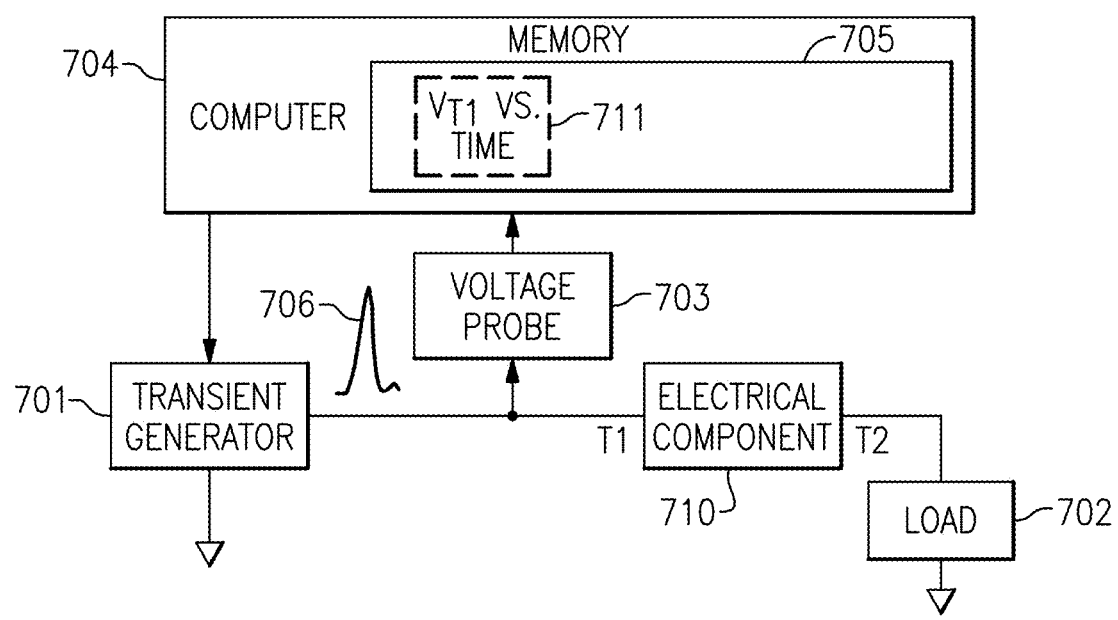
FIG. 7A is a schematic diagram of one embodiment of an electronic component characterization system in a first step of operation.

FIG. 7A is a schematic diagram of one embodiment of an electronic component characterization system in a first step of operation. The electronic component characterization system is characterizing an electronic component 710, and includes a transient generator 701, a load 702, a voltage probe 703, and a computer 704 that includes and/or is coupled to a memory 705. The computer 704 can correspond to a processor, microcontroller, and/or any other suitable digital processing apparatus.

As shown in FIG. 7A, the transient generator 701 generates an electrical transient 706 that is provided to a first terminal T1 of the electronic component 710. Additionally, a second terminal T2 of the electronic component 710 is connected to ground through the load 702. The transient generator 701 is also grounded. The transient generator 701 is controlled by the computer 704, in this example.

In the first step, the voltage probe 703 obtains a first set of voltage versus time measurements 711 of the first terminal T1. The first set of voltage versus time measurements 711 are stored in the memory 705.

Figure 7B:
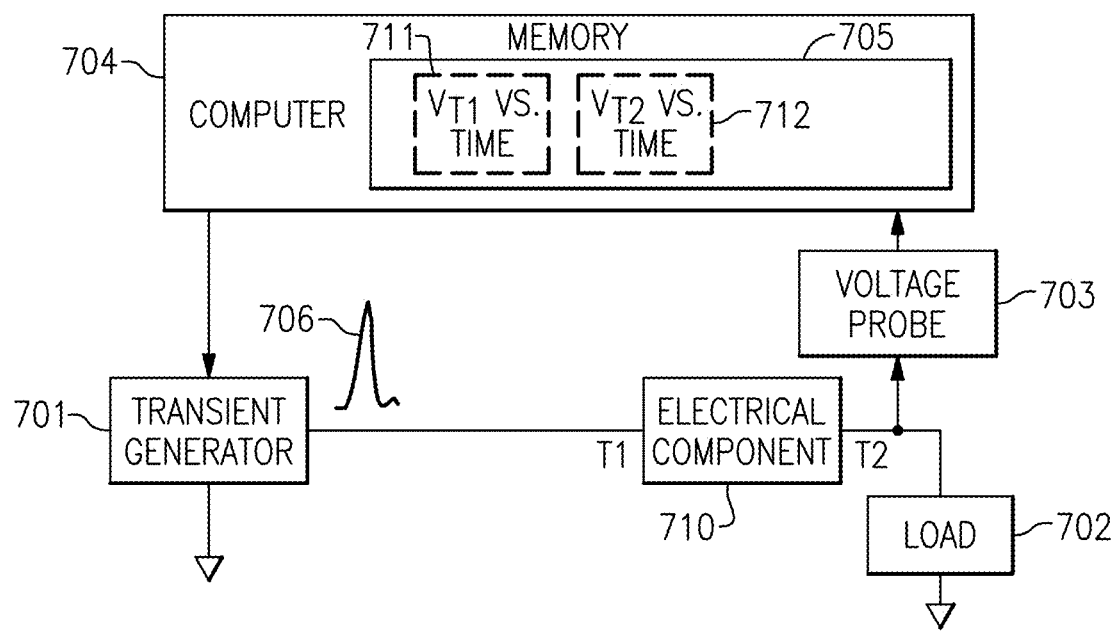
FIG. 7B is a schematic diagram of the electronic component characterization system of FIG. 7A in a second step of operation.

FIG. 7B is a schematic diagram of the electronic component characterization system of FIG. 7A in a second step of operation.

In the second step, the voltage probe 703 has been repositioned to probe the second terminal T2 of the electronic component 710 and the electrical transient 706 is regenerated and reapplied to the first terminal T1 of the electronic component 710. Additionally, the voltage probe 703 obtains a second set of voltage versus time measurements 712 of the second terminal T2, which are stored in memory 705.

In certain implementations, the computer 704 directs (for example, by way of an application executed on the computer's processor) movement of the voltage probe 703 from the first terminal T1 to the second terminal T2 using a handler or other suitable repositioning mechanism. However, other implementations, are possible, such as configurations in which the voltage probe 703 is moved manually between steps.

Although FIGS. 7A and 7B depict a configuration using a single probe, the teachings herein are also applicable to configurations using multiple voltage probes. However, using a single voltage probe eliminates measurements inaccuracies arising from the probes loading one another.

Furthermore, although FIGS. 7A and 7B depict the measurements of the first terminal T1 being obtained before the measurements of the second terminal T2, the order in which the measurements are obtained can be reversed (or performed concurrently in an implementation with two voltage probes).

Figure 7C:
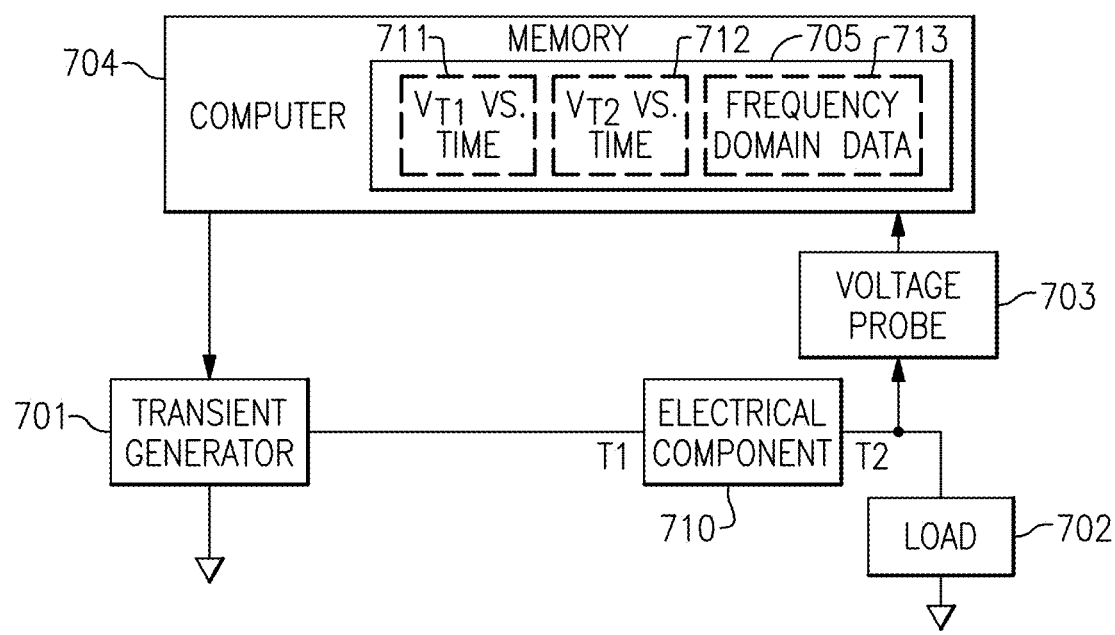
FIG. 7C is a schematic diagram of the electronic component characterization system of FIG. 7A in a third step of operation.

FIG. 7C is a schematic diagram of the electronic component characterization system of FIG. 7A in a third step of operation.

In the third step, the computer 704 processes the first set of voltage versus time measurements 711 and the second set of voltage versus time measurements 712 to generate frequency domain data 713. For example, such frequency domain data 713 can include a first set of FFT coefficients obtained from performing an FFT of the first set of voltage versus time measurements 711, and a second set of FFT coefficients obtained from performing an FFT of the second set of voltage versus time measurements 712.

In certain embodiments, the first step, the second step, and the third step are repeated for multiple amplitude values of the electrical transient 706 such that the voltage versus time data and frequency domain data is captured for multiple transient amplitudes. Capturing such data for two or more transient amplitudes enhances the accuracy of the electrical characterization and resulting selection process of a suitable component.

Figure 7D:
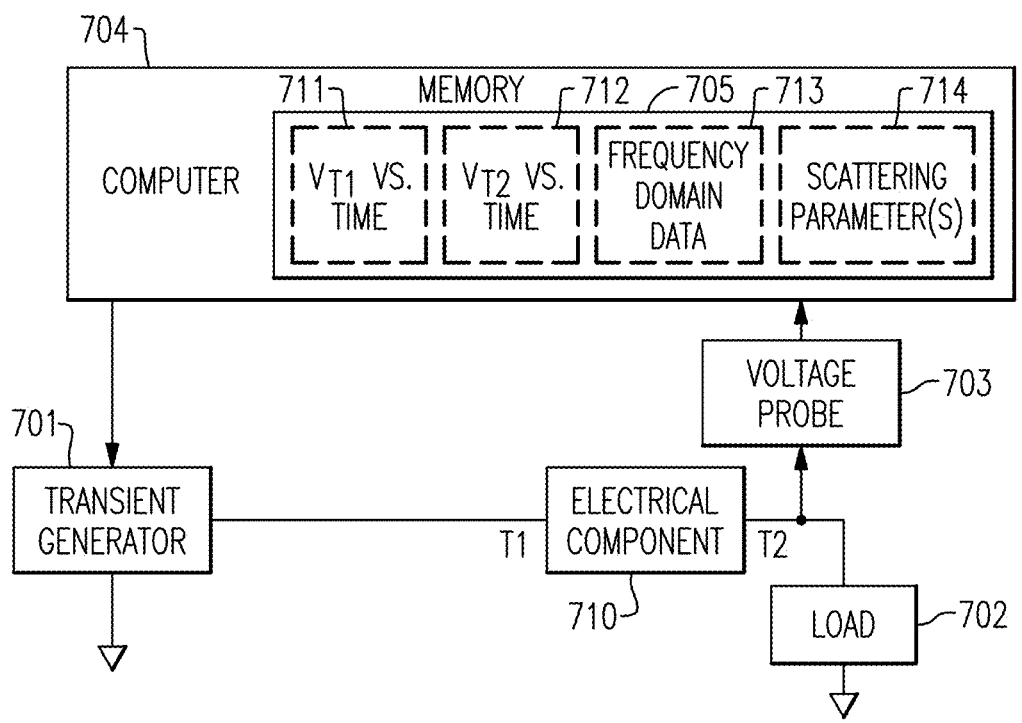
FIG. 7D is a schematic diagram of the electronic component characterization system of FIG. 7A in a fourth step of operation.

FIG. 7D is a schematic diagram of the electronic component characterization system of FIG. 7A in a fourth step of operation.

In the fourth step, the computer 704 processes the frequency domain data 713 to determine one or more scattering parameters 714. For example, such scattering parameters or S-parameters can include S11, S12, S21, and S22. The scattering parameters are stored in the memory 705.

Figure 7E:
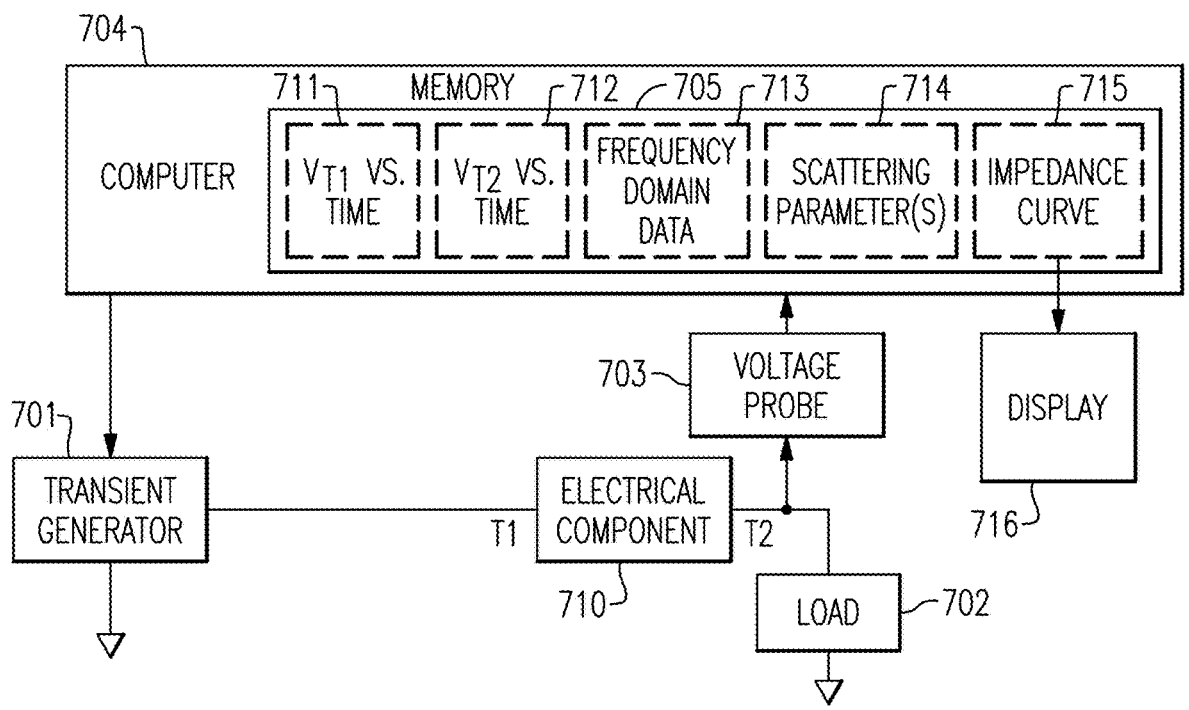
FIG. 7E is a schematic diagram of the electronic component characterization system of FIG. 7A in a fifth step of operation.

FIG. 7E is a schematic diagram of the electronic component characterization system of FIG. 7A in a fifth step of operation.

In the fourth step, the computer 704 processes the scattering parameters to determine impedance curve data 715, which is stored in the memory 705. In certain implementations, the impedance curve data 715 is processed and provided to a display 716 to thereby display impedance trajectories or graphs representing the behavior of the electrical component 710. In certain implementations, the display 716 is used to display other data stored in the memory 705, such as the first set of voltage versus time measurements 711, the second set of voltage versus time measurements 712, the frequency domain data 713, and/or the scattering parameters 714.

Figure 8A:
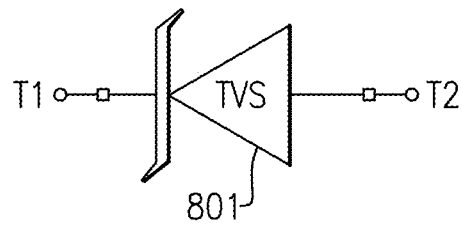
FIG. 8A is a schematic diagram of one example of a device suitable for electrical characterization.
Figure 8B:
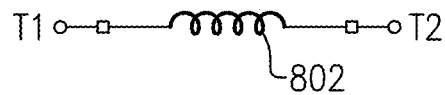
FIG. 8B is a schematic diagram of another example of a device suitable for electrical characterization.
Figure 8C:
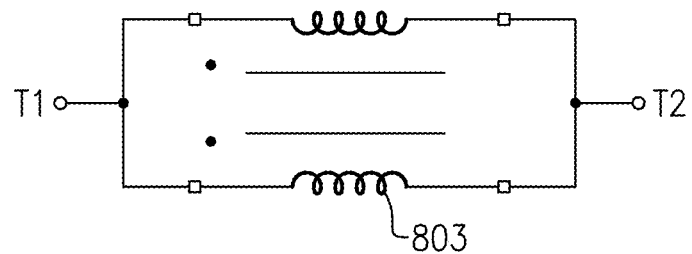
FIG. 8C is a schematic diagram of another example of a device suitable for electrical characterization.

FIGS. 8A to 8C represent example devices that can be characterized in accordance with the teachings herein. Although various examples of devices are shown, any suitable device can be characterized using the apparatus and methods for electrical characterization disclosed herein.

FIG. 8A is a schematic diagram of one example of a device suitable for electrical characterization. In this example, the device corresponds to a transient voltage suppression (TVS) diode having a cathode serving as a first terminal T1 and an anode serving as a second terminal T2.

FIG. 8B is a schematic diagram of another example of a device suitable for electrical characterization. In this example, the device corresponds to an inductor or choke 802 having one end serving as a first terminal T1 and another end serving as a second terminal T2.

FIG. 8C is a schematic diagram of another example of a device suitable for electrical characterization. In this example, the device corresponds to a common-mode choke 803 having four terminals. As shown in FIG. 8C, one pair of terminals are connected to one another to serve as the first terminal T1 for characterization, while another pair of terminals are connected to one another to serve as the second terminal T2 for characterization.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

What is claimed is:

1. A method of electrical characterization, the method comprising:
    connecting a first terminal of an electrical component to a transient generator;
    connecting a second terminal of the electrical component to a load such that the electrical component and the load are connected in series between the transient generator and a ground voltage;
    generating an electrical transient comprising a pulse using the transient generator;
    obtaining a first plurality of voltage versus time measurements at the first terminal of the electrical component in response to the electrical transient received from the transient generator;
    obtaining a second plurality of voltage versus time measurements at the second terminal of the electrical component in response to the electrical transient;
    processing the first plurality of voltage versus time measurements and the second plurality of voltage versus time measurements to generate frequency domain data; and
    determining at least one scattering parameter from the frequency domain data.

2. The method of claim 1, wherein the at least one scattering parameter includes an S21 parameter.

3. The method of claim 1, further comprising using a fast Fourier transform (FFT) to generate the frequency domain data.

4. The method of claim 1, wherein no current probe is used.

5. The method of claim 1, further comprising obtaining voltage versus time measurements at the first terminal and the second terminal for a plurality of electrical transient pulses of different peak voltage levels.

6. The method of claim 1, wherein the first plurality of voltage versus time measurements are obtained using a probe in response to the electrical transient, and wherein the second plurality of voltage versus time measurements are also obtained using the same probe in response to the transient generator reapplying the electrical transient.

7. The method of claim 1, further comprising generating an impedance curve for the electrical component using the at least one scattering parameter.

8. The method of claim 1, wherein the transient generator is an electrical fast transient (EFT) generator, and the electrical transient is an EFT pulse.

9. The method of claim 1, wherein determining the at least one scattering parameter includes determining an S21 parameter, an S12 parameter, an S11 parameter, and an S22 parameter.

10. The method of claim 1, further comprising:
    providing the electrical transient to the first terminal such that the electrical component receives the full electrical transient.

11. The method of claim 1, wherein connecting the first terminal of the electrical component to the transient generator comprises connecting the first terminal of the electrical component directly to the transient generator.

12. The method of claim 1, wherein connecting the second terminal of the electrical component to the load comprises connecting the second terminal to the load such that the second terminal is directly connected to the load and the load is directly connected to the ground voltage.

13. The method of claim 1, further comprising:
    providing the electrical transient solely to the first terminal of the electrical component.

14. An electronic component characterization system comprising:
    a transient generator configured to provide an electrical transient to a first terminal of an electrical component undergoing characterization, wherein the electrical transient comprises a pulse;
    a load configured to connect to a second terminal of the electrical component such that the electrical component and the load are connected in series between the transient generator and a ground voltage;
    one or more voltage probes configured to obtain a first plurality of voltage versus time measurements at the first terminal of the electrical component in response to the electrical transient, and to obtain a second plurality of voltage versus time measurements at the second terminal of the electrical component in response to the electrical transient; and
    a computer configured to process the first plurality of voltage versus time measurements and the second plurality of voltage versus time measurements to generate frequency domain data, and to determine at least one scattering parameter from the frequency domain data.

15. The electronic component characterization system of claim 14, wherein the at least one scattering parameter includes an S21 parameter.

16. The electronic component characterization system of claim 14, wherein the computer is further configured to generate the frequency domain data using a fast Fourier transform (FFT).

17. The electronic component characterization system of claim 14, wherein the one or more voltage probes includes a common voltage probe that obtains the first plurality of voltage versus time measurements in response to the electrical transient, and that obtains the second plurality of voltage versus time measurements in response to the transient generator reapplying the electrical transient.

18. The electronic component characterization system of claim 14, wherein the one or more voltage probes includes a first voltage probe that obtains the first plurality of voltage versus time measurements, and a second voltage probe that obtains the second plurality of voltage versus time measurements.

19. The electronic component characterization system of claim 14, wherein the computer is further configured to generate an impedance curve data for the electrical component based on the at least one scattering parameter.

20. The electronic component characterization system of claim 19, further comprising a display configured to display an impedance graph corresponding to the impedance curve data.

21. The electronic component characterization system of claim 14, wherein the transient generator is an electrical fast transient (EFT) generator, and the electrical transient is an EFT pulse.

22. The electronic component characterization system of claim 14, wherein determining the at least one scattering parameter includes determining an S21 parameter, an S12 parameter, an S11 parameter, and an S22 parameter.

23. The electronic component characterization system of claim 14, wherein the computer comprises a memory storing the first plurality of voltage versus time measurements, the second plurality of voltage versus time measurements, the frequency domain data, and the at least one scattering parameter.

24. An electronic component characterization system comprising:

a transient generator configured to provide an electrical transient to a first terminal of an electrical component undergoing characterization, wherein the electrical transient comprises a pulse;

a load configured to connect to a second terminal of the electrical component such that the electrical component and the load are connected in series between the transient generator and a ground voltage;

one or more voltage probes configured to obtain a first plurality of voltage versus time measurements at the first terminal of the electrical component in response to the electrical transient, and to obtain a second plurality of voltage versus time measurements at the second terminal of the electrical component in response to the electrical transient; and means for processing the first plurality of voltage versus time measurements and the second plurality of voltage versus time measurements to generate frequency domain data and at least one scattering parameter.

* * * * *